United States Patent
Yen et al.

(10) Patent No.: US 8,809,073 B2
(45) Date of Patent: Aug. 19, 2014

(54) APPARATUS AND METHODS FOR DE-EMBEDDING THROUGH SUBSTRATE VIAS

(75) Inventors: Hsiao-Tsung Yen, Tainan (TW); Yu-Ling Lin, Taipei (TW); Chin-Wei Kuo, Zhubei (TW); Victor Chih Yuan Chang, Hsin-Chu (TW); Min-Chie Jeng, Taipei (TW)

(73) Assignee: Taiwan Semiconductor Manufacturing Company, Ltd., Hsin-Chu (JP)

( * ) Notice: Subject to any disclaimer, the term of this patent is extended or adjusted under 35 U.S.C. 154(b) by 407 days.

(21) Appl. No.: 13/197,602

(22) Filed: Aug. 3, 2011

(65) Prior Publication Data

US 2013/0032799 A1 Feb. 7, 2013

(51) Int. Cl.
*H01L 21/66* (2006.01)
*G01R 31/26* (2014.01)

(52) U.S. Cl.
USPC ........... 438/14; 438/17; 438/18; 257/E23.145; 257/E21.523; 324/527; 324/762.01; 324/750.16; 702/117

(58) Field of Classification Search
USPC ........... 257/48, 774; 438/14, 17–18; 702/117, 702/119, 123; 324/525, 527, 756.01, 324/756.02, 756.05, 762.01, 750.16
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |

(Continued)

OTHER PUBLICATIONS

Blaschke, V., et al., "Accurate Inductance De-embedding Technique for Scalable Inductor Models," IEEE International Conference on Microelectronic Test Structures, 2007, ICMTS '07, pp. 248-252.

(Continued)

*Primary Examiner* — Jose R Diaz
(74) *Attorney, Agent, or Firm* — Slater and Matsil, L.L.P.

(57) ABSTRACT

A method includes providing on a substrate having at least two through substrate vias ("TSVs") a plurality of test structures for de-embedding the measurement of the intrinsic characteristics of a device under test (DUT) including at least two of the TSVs; measuring the intrinsic characteristics [L] for a first and a second test structure on the substrate including two pads coupled with a transmission line of length L; using simultaneous solutions of ABCD matrix or T matrix form equations, and the measured intrinsic characteristics, solving for the intrinsic characteristics of the pads and the transmission lines; de-embedding the measurements of the third and fourth test structures using the intrinsic characteristics of the pads and the transmission lines; and using simultaneous solutions of ABCD matrix or T matrix form equations for BM_L and BM_LX, and the measured intrinsic characteristics, solving for the intrinsic characteristics of the TSVs.

11 Claims, 9 Drawing Sheets

(56) References Cited

U.S. PATENT DOCUMENTS

| | | | |
|---|---|---|---|
| 6,740,582 B2 | 5/2004 | Siniaguine | |
| 6,800,930 B2 | 10/2004 | Jackson et al. | |
| 6,832,170 B2* | 12/2004 | Martens | 702/65 |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,954,080 B2 | 5/2011 | Yen et al. | |
| 2009/0224772 A1* | 9/2009 | Jagannathan et al. | 324/601 |
| 2010/0171226 A1* | 7/2010 | West et al. | 257/774 |
| 2011/0001504 A1* | 1/2011 | Cho et al. | 324/756.01 |
| 2011/0254576 A1* | 10/2011 | Cho | 324/756.01 |

OTHER PUBLICATIONS

Cho, M.-H., et al., "A novel cascade-based de-embedding method for on-wafer microwave characterization and automatic measurement," 2004 IEEE MTT-S International Microwave Symposium Digest, vol. 2, Jun. 6-11, 2004, pp. 1237-1240.

Guo, J.-C., et al., "A Broadband and Scalable Lumped Element Model for Fully Symmetric Inductors Under Single-Ended and Differentially Driven Operations," IEEE Transactions on Electron Devices, vol. 54, Issue 8, Aug. 2007, pp. 1878-1888.

Kolding, T.E., et al., "Ground-shielded measuring technique for accurate on-wafer characterization of RF CMOS Devices," Proceedings of the 2000 International Conference on Microelectronic Test Structures, ICMTS 2000, pp. 246-251.

Smith, S., et al., "Analysis of the Performance of a Micromechanical Test Structure to Measure Stress in Thick Electroplated Metal Films," 2010 IEEE International Conference on Microelectronic Test Structures, Mar. 22-25, Hiroshima, Japan, pp. 80-85.

Smith, S., at al., "Fabrication of Test Structures to Monitor Stress in SU-8 Films used for MEMS Applications," 2010 IEEE International Conference on Microelectronic Test Structures, Mar. 22-25, Hiroshima, Japan, pp. 8-13.

Smith, S., et al., "Kelvin Resistor Structures for the Invesitgation of Corner Serif Proximity Correction," 2010 IEEE International Conference on Microelectronic Test Structures, Mar. 22-25, Hiroshima, Japan, pp. 24-29.

Stucchi, M., et al., "Test Structures for Characterization of Through Silicon Vias," 2010 IEEE International Conference on Microelectronic Test Structures, Mar. 22-25, Hiroshima, Japan, pp. 130-134.

* cited by examiner

APPARATUS AND METHODS FOR DE-EMBEDDING THROUGH SUBSTRATE VIAS

BACKGROUND

A common requirement of current integrated circuit manufacturing and packaging is the use of interposers to receive single or multiple integrated circuit dies. Recently, the use of three-dimensional IC ("3DIC") packaging is increasing; and this vertically oriented approach requires stacking. Stacking of devices requires forming vertical connections between devices. The use of through vias or through substrate vias ("TSVs") extending through the interposers is increasingly used with 3DIC assemblies. These through vias allow electrical coupling between integrated circuit dies and components mounted on one side of an interposer, and terminals such as solder balls mounted on the opposite side of the interposer. Further, the use of TSV technologies with silicon interposer substrates enable wafer level processing ("WLP") of the interposer assemblies. This technique is increasingly applicable to increasing memory or storage device density, for example, or increasing system complexity without added circuit board area. As demand for hand held and portable devices such as smart phones and tablet computers increases, board area and board size restrictions also increases, and the use of the interposer assemblies and TSVs can help meet these requirements. Vertically stacking of components using TSV technologies in 3DIC assemblies is increasingly used in developing advanced integrated systems.

Testing or qualification of TSVs and bumps or microbumps on interposers provide additional challenges. The resistance ("R") of a single TSV is very small and measurements are therefore difficult. Similar challenges exist with respect to the inductance ("L") and capacitance ("C") of the TSVs.

A continuing need thus exists for methods and apparatus to efficiently perform de-embedding of parasitics for TSVs without the problems experienced when using the known methods.

BRIEF DESCRIPTION OF THE FIGURES

For a more complete understanding of the present embodiments, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments or the claims.

Embodiments of the present application which are now described in detail provide novel methods and apparatus embodiments for performing interposer TSV and bump measurements with parasitics de-embedded using only a few measurements at test, and with a minimum number of dummy structures. The measurements can be used to calibrate TSV models for simulation and engineering work, and to qualify the finished TSV or bumps on the interposers. The embodiments require very few devices under test ("DUTs") to provide accurate results for the wafer, saving costs over direct measurements at a wafer acceptance test ("WAT") point. The embodiments are computationally efficient and results are quickly obtained.

The methods are not limited to TSV and may be advantageously used to provide de-embedding measurements for paths that include bumps, microbumps, solder columns and the like; all connections commonly used in 3DIC assemblies where access to individual devices is limited, the physical quantities measured are quite small, such as RLC for TSVs, bumps, or small connectors, and the use of WAT approaches is time consuming and costly, increasing the need for accurate modeling and qualification using fewer measurements.

Figure 1:
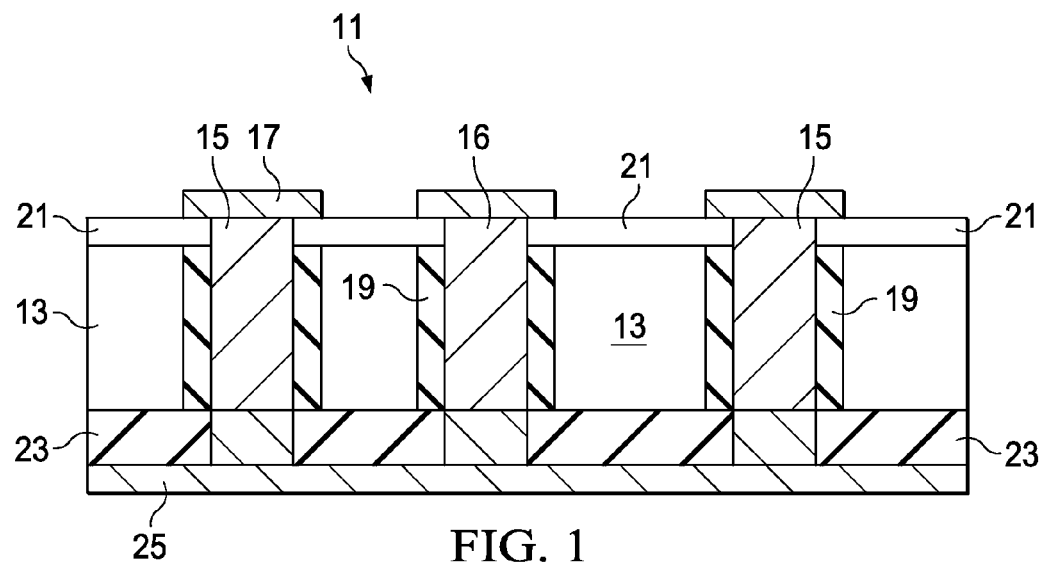
FIG. 1 depicts in a cross-section an interposer and TSV structures.

FIG. 1 depicts in a cross-sectional view an example assembly 11 which uses a TSV interposer 13. This example is presented merely to illustrate how TSV interposers may be used with integrated circuits and is not limiting on the embodiments or the claims.

In FIG. 1, the interposer is a substrate which may be a semiconductor wafer or other substrate material used in integrated circuit technologies, such as BT resin, PC board, ceramic, glass, epoxy resin or other substrate material. In many applications silicon wafers are used as the substrate, which has the advantage of enabling the use of semiconductor process tools such as etchers, photolithography, molding machines and the like in a wafer level processing ("WLP") approach. However the embodiments are not limited to any particular substrate material.

TSVs 15 and 16 are shown extending from an upper surface of the substrate through the substrate 13. TSVs 15 are filled vias. To form these, holes are formed in a thicker substrate, using for example, reactive ion etch ("RIE") or deep RIE equipment on a semiconductor wafer. The vias are "blind vias", that is they extend from one surface into the substrate. After the etch, electroless or electroplating processes are used to fill the vias with a conductor. Copper may be used, or other conductors used in semiconductor processes such as aluminum, copper alloys, aluminum alloys and the like. A barrier dielectric 19 isolates the conductor within the vias 15, 16 from the substrate, and this dielectric, typically an oxide such a SiO2, although other oxides, nitrides and dielectrics are sometimes used, provides an insulator and a diffusion barrier. The via then forms a capacitance with the substrate, Cox.

Backside operations that thin the substrate 13 may be used to expose the bottom of vias 15, 16 to complete the vias. A passivation or polyimide layer 23 may be applied and additional conductive material may be used to form contacts to the vias 15 for coupling the backside metal 25 to the vias.

A top metal layer 17 overlies the upper portion of the vias 15, 16. In an application, this may be the "die side" of the finished interposer and integrated circuit devices (not shown) may be mounted over a passivation layer 21 and coupled electrically to the substrate using microbumps, solder bumps, solder balls or columns; for example. Wire bonds also could be used. The top metal layer may be a metal 1 material such as copper, aluminum, polysilicon, or other conductive material. Barrier layers, diffusion barriers, and coatings could be used. Alloys and platings such as nickel, gold, palladium, titanium, tantalum could be used to improve the adhesion, reduce diffusion, or provide anti-reflective coatings as is known in the art.

A backside metal layer 25 is also formed over the dielectric or passivation layer 23. This layer may provide a common terminal for some structures as described below, although that is not necessary for the embodiments. This layer may form the "board side" or "solder ball side" of a finished interposer and may receive solder balls or solder columns (not shown) for mounting the finished interposer assembly 13 to another wafer or a circuit board to form a 3DIC system.

Substrate 13 may be a through interposer stack substrate, which is free from transistors. Alternatively, substrate 13 may be a through transistor stack substrate and may include active integrated circuits. Each of these types of substrates has specific requirements and characteristics as are described below.

Figure 2:
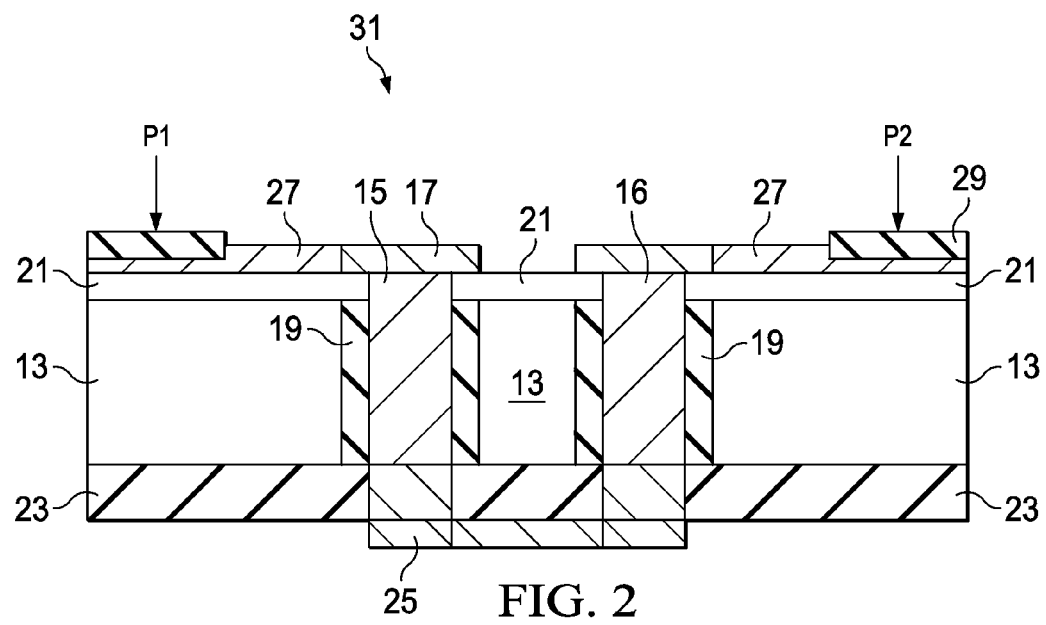
FIG. 2 depicts in a cross-section two TSVs coupled together for a measurement.

FIG. 2 depicts in cross-section a portion of a device under test "DUT" 31 and illustrates the requirements for de-embedding. In order to measure the intrinsic characteristics of a TSV 15, the RF GSG probes may be placed on two pads, Substrate 13 is typically quite thin, and may be from 10-100 microns or more in thickness. Because the TSVs are small, the intrinsic characteristics are so small as to make measurements difficult. The TSVs may have high aspect ratios, and small diameters. The diameter is not limited but could be as small as 5-15 microns, with a thickness of 20-100 microns. The conductive material is low in resistance and so the R value for the TSVs is quite small. For example, one illustrative application has TSVs with R values as low as 38 milliohms, and inductance (L) as low as 77.8 picohenrys (pH) These quantities make accurate measurements by wafer probe very difficult, even using probes that are RF ground signal ground ("GSG") probes.

FIG. 2 is a simplified structure that further illustrates in an example a measurement on a DUT. In FIG. 2, the TSVs 15 and 16 are coupled with backside metal 25 to form an example test structure. Probes P1 and P2 are placed on pads 29 and a signal path is formed through a first pad, a top metal trace 27, a first metal 17, the TSV 15, backside metal 25, a second TSV 16, a second first metal portion 17, a second top metal trace 27 and a second pad 29.

In taking, for example, a resistance measurement, the measurement between P1 and P2 would include parasitics for the two pads 29, the two traces 27. The contribution of these elements, including characteristics of the probe pins themselves which also contribute to the observed R value, must be removed or "de-embedded" to get the intrinsic characteristic for the test device.

In order to make better measurements of such small quantities as a TSV resistance or impedance, it might be necessary to measure a larger value and subtract a value for a dummy structure, for example, to reach the value for the smaller element.

This approach is now used in an embodiment to measure characteristics for TSV. The substrate has no active devices and is electrically floating at the wafer probe, which may impact the types of measurements made.

Figure 3:
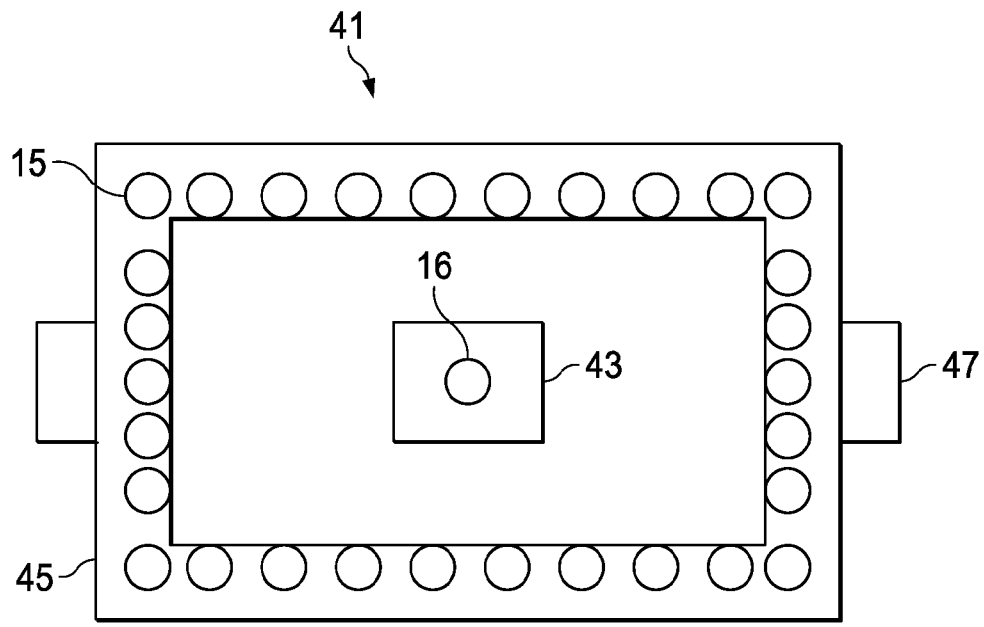
FIG. 3 depicts in a plan view a test structure embodiment.

In FIG. 3, a top view of a test structure 41 is shown. In this view, TSV 16 is the center portion, and has a portion 43 of a first metal layer overlying it. TSVs 15 are shown formed in a ring around the center TSV 16 and are coupled together by a portion 45 of the first metal layer. Pads 47 are coupled to the ring for receiving ground probes in a GSG probe operation.

Figure 4:
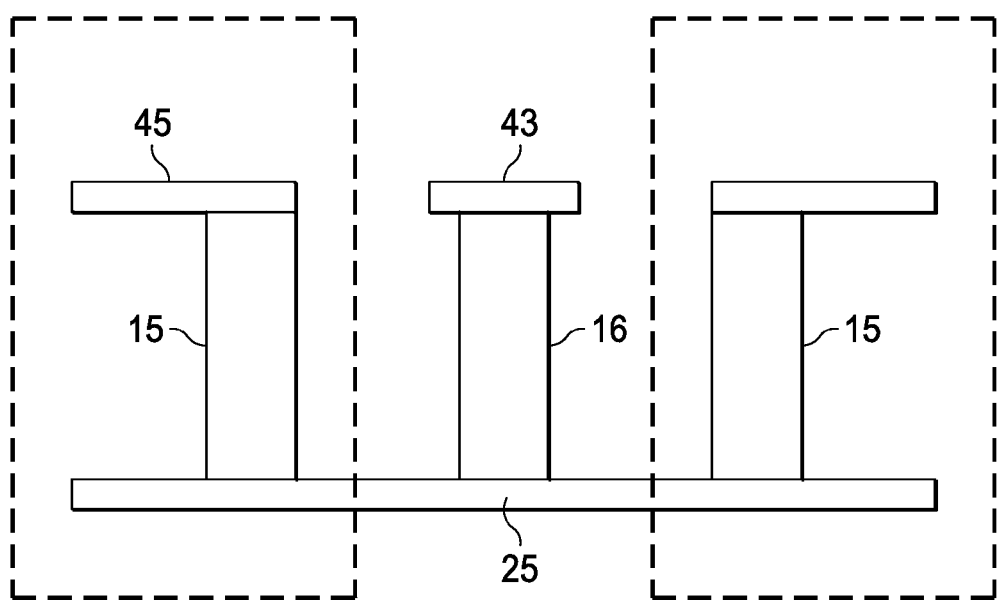
FIG. 4 depicts in a cross-section a portion of the structure of FIG. 3.

In FIG. 4 a cross-section is provided that illustrates the bottom metal portion 25 of the structure of FIG. 3. TSV 16 is shown with two TSVs 15 on either side, and the first metal portions 43 and 45 are shown overlying the respective TSVs. The bottom metal 25 couples this structure together, all of the TSVs are coupled to the bottom metal. A path from portion 43 through the TSV 16, into the bottom metal 25, and back through the TSVs 14 to portion 45, is thus formed as a test structure.

Measuring the intrinsic characteristics of a single TSV such as TSV 16 is, as described above, difficult for several reasons. The actual physical values of the intrinsic characteristics of the TSV are quite low, which makes the measurement difficult. Further, the TSV measurement includes traces, pads and probes which have to be de-embedded.

One method to increase accuracy of measuring a small resistance, for example a TSV, is to measure a test structure that includes that resistance with others, and then, remove the extra resistance mathematically. In this way the resistance or other quantity measured will be sufficiently large to enable an accurate measurement. The structure of FIGS. 3 and 4 enables such a measurement from a signal pad 43 in the central portion of Figure to the ground pads 47.

Figure 5:
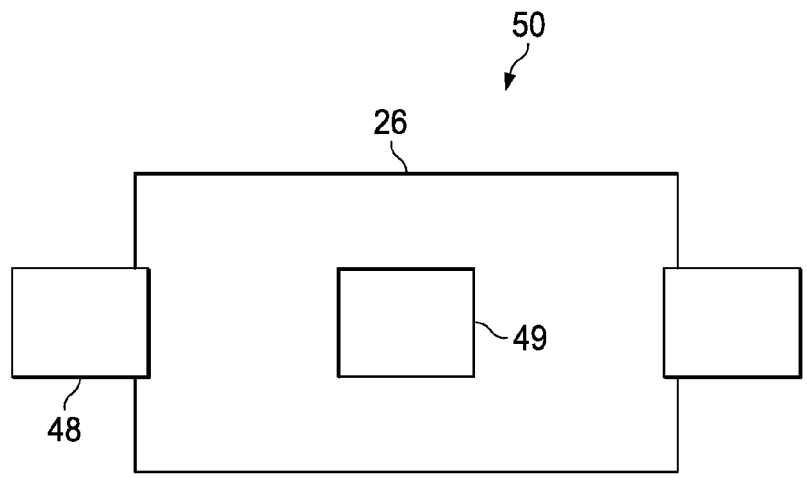
FIG. 5 depicts in a plan view a dummy structure.

FIG. 5 depicts in a top view a dummy structure 50 that can be used with the structures of FIGS. 3 and 4 to complete the resistance measurement. By forming a dummy structure that is equivalent to the backside metal 25 in FIG. 4, and measuring the intrinsic characteristics, for example the resistance, this value may be subtracted from the resistance value measured for the overall test structure, and the value for the single TSV or multiple TSVs can be determined. In FIG. 5, the backside metal 26 is designed to be the equivalent of the backside metal 25 in FIG. 4. The pads 48 and 49 are provided and a GSG probe can be used to measure the intrinsic characteristics of the dummy structure. This gives a value that can be subtracted to get the values for the TSVs in FIGS. 3 and 4.

Figure 6:
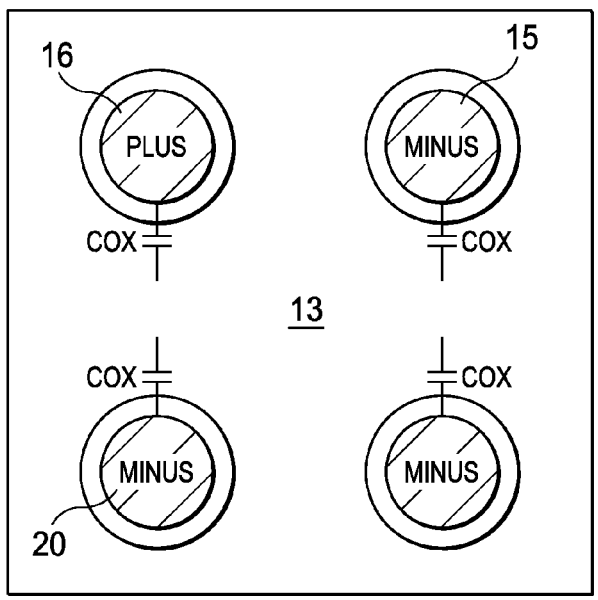
FIG. 6 depicts in a plan view another embodiment structure.

FIG. 6 depicts in a plan view a structure for measuring the capacitance Cox due to the sidewall liner for a TSV such as 16. A bias such as a positive voltage PLUS is placed on TSV 16, for example. The surrounding TSVs are biased to a negative voltage MINUS for example. Each TSV 15 or 16 has a sidewall liner 20 formed of a dielectric and thus, a capacitor is formed between the TSV and the substrate 13.

Figure 7:
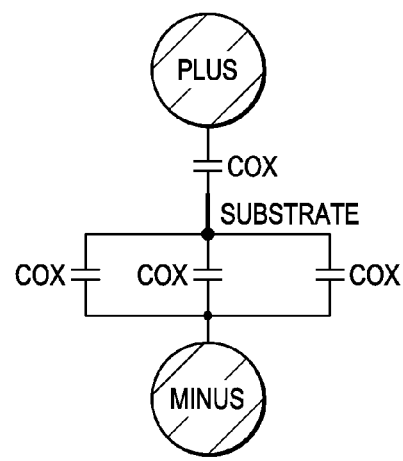
FIG. 7 depicts a simple circuit model for the structure of FIG. 6.

FIG. 7 depicts a simplified circuit diagram to explain a method embodiment for obtaining the capacitance value Cox. The substrate 13 is floating in this arrangement, and a backside metal 25 couples the TSVs together at one end. Thus the simplified circuit diagram in FIG. 7 illustrates how the TSV 16 forms a first capacitor in series with the capacitors of the parallel capacitors for TSV 15. The total measured capacitance will be, for a case of 3 TSVs 15, given by the relation in Equation 1:

$$C_{total} = Cox \text{ in series parallel with } 3Cox, = \tfrac{3}{4}Cox. \quad \text{(Equation 1)}$$

This can be extended to the general case of 1 series TSV via coupled with "n" parallel TSVs, as:

$$C_{total} = n/(n+1)*Cox. \quad \text{(Equation 2)}$$

Thus, if n is greater than 30, for example, Ctotal is 0.97 Cox, and as more surrounding TSVs are added to the measurement, the equation for Ctotal approaches Cox.

By using this relation and measuring Ctotal in the structure of FIG. 6, the value for Cox is obtained from the total capacitance, so long as the number of parallel TSVs surrounding the TSV such as 16 is sufficiently large.

Figure 8:
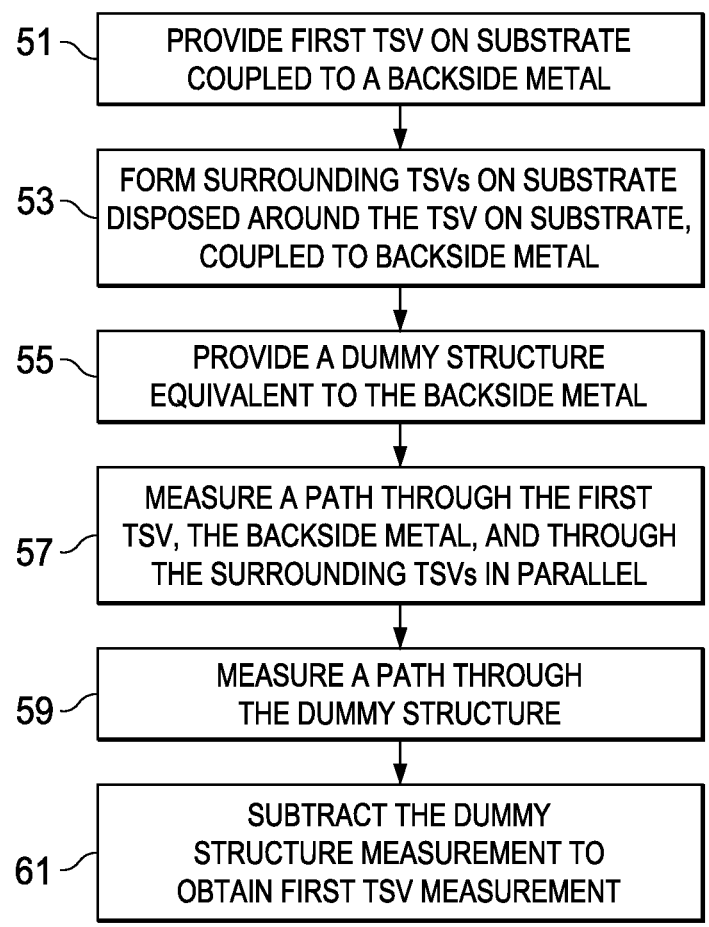
FIG. 8 depicts a flow diagram for a method embodiment.

FIG. 8 depicts in a flow chart a method embodiment for the above measurement. In step 51, a first TSV is provided on a substrate, coupled to a backside metal, such as TSV 16 in FIG. 3. In step 53, this first TSV is surrounded by additional TSVs coupled to the backside metal. In step 55, a dummy structure is provided that is equivalent to the backside metal. In step 57, a measurement is made through the first TSV, the backside metal, and through the surrounding TSVs in parallel. In step 59 the dummy structure is measured. In step 61, the subtraction is performed to extract the value (for example, resistance) for the first TSV.

Figure 9:
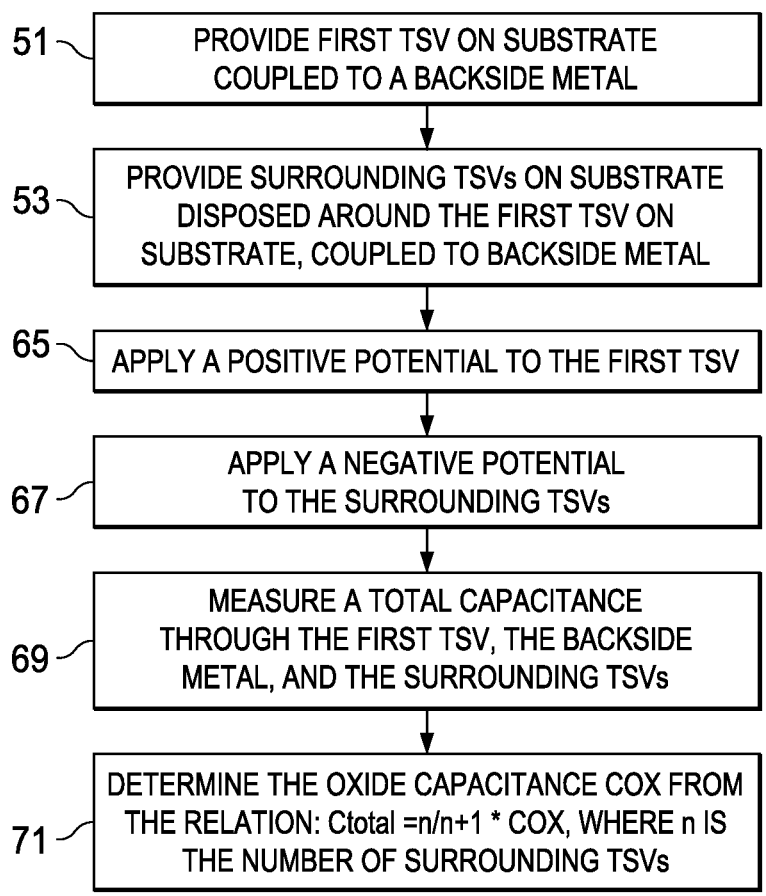
FIG. 9 depicts a flow diagram for another method embodiment.

FIG. 9 depicts in a flow chart an alternative method for determining the capacitance Cox using the structures described above. Some of the steps are the same as those in FIG. 8 and like numerals are used. In step 51, the first TSV is provided on the substrate, coupled to a backside metal. In step 53, the surrounding TSVs are formed around the first TSV. In step 65, a positive potential is applied to the first TSV. In step 67, a negative potential is applied to the surrounding TSVs. In step 69 a measurement of the capacitance is made through for the path the first TSV to the substrate and backside metal, and then through the surrounding TSVs in parallel. In step 71, the capacitance Cox can be calculated. If the number n of surrounding TSVs is sufficiently large, the Cox is approximately given by Ctotal; otherwise the Cox capacitance can be easily calculated.

Figure 10:
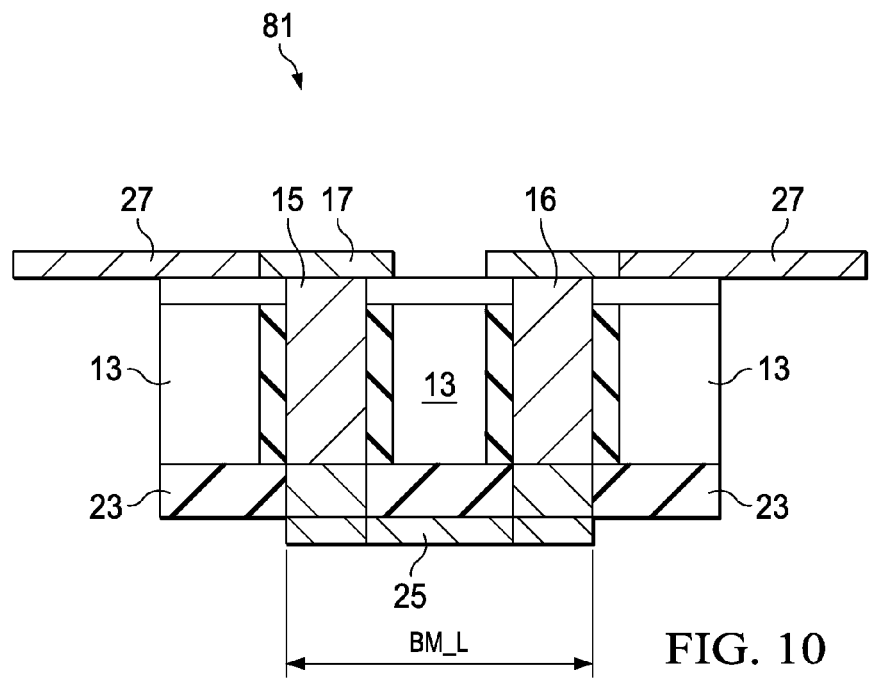
FIG. 10 depicts in a cross-section an embodiment with de-embedding shown.

FIG. 10 depicts in a cross-sectional view a device under test (DUT) structure for use in another embodiment. In FIG. 10, TSVs 15 and 16 extend through substrate 13 and are coupled through a length of backside metal 25 having a length BM_L. First metal 27 forms traces that can be used for probing and measuring. As explained above, to get the intrinsic characteristics of the TSVs, a measurement on a path that includes the traces 27 has to be "de-embedded" to remove the parasitic values.

Some of the inventors of this application previously filed U.S. patent application Ser. No. 12/042,606, entitled "De-Embedding Method for On-Wafer Devices"; filed Mar. 5, 2008, which application is hereby incorporated in its entirety herein by reference. The patent application describes methods for de-embedding traces and pads from a device under test ("DUT") measurement. The methods of the above referenced patent will be further extended by novel method embodiments directed at TSV structures and methods, as described further below.

Figure 11:
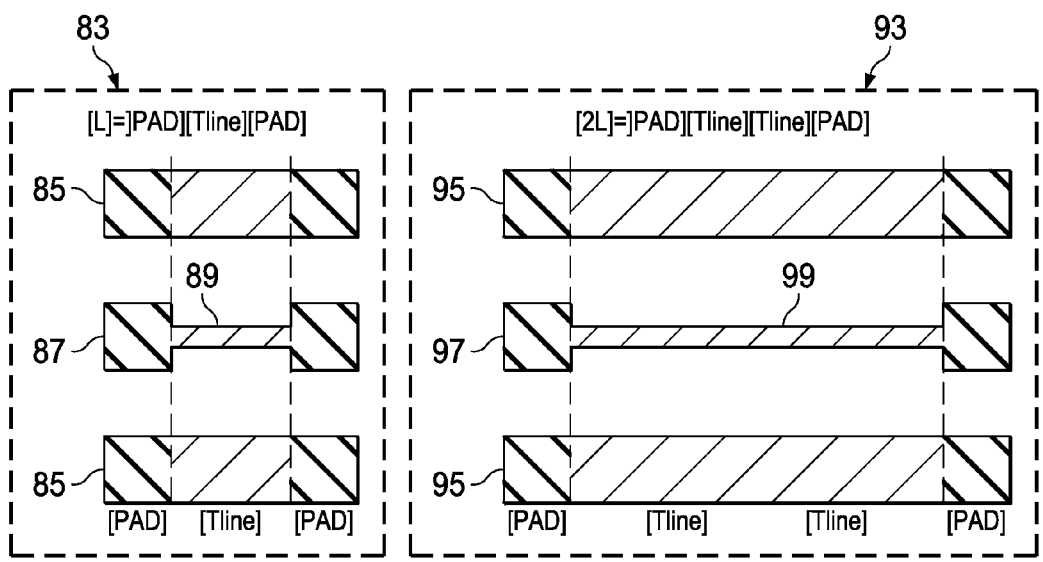
FIG. 11 depicts a pair of test structures for use with an embodiment.

In FIG. 10, the traces 27 and any pads or probes that are in the measurement path must be de-embedded. FIG. 11 depicts how a pair of test structures can be used to provide the values needed for de-embedding these portions.

In FIG. 11 a first test structure 83 is shown. This structure includes a transmission line 89 and pads 87 at each end. Pads 85 are also provided for grounding for the GSG probes. Similarly, test structure 93 is provided. This structure provides a transmission line 99 that is, in this example case, of length twice that of the transmission line 89. Pads 97, which are the same size and in the same metal layer as pads 87, are at each end.

A measurement of each pad-line-pad combination in the test structures: 87-89-87, and 97-99-97; may be made using the RF GSG probe, for example. Using the ABCD matrix or T matrix form for transmission elements, the intrinsic characteristic measurements for line 89 can be expressed as:

$$[L] = [PAD][Tline][PAD] \quad \text{(Equation 3)}$$

$$[2L] = [PAD][Tline][Tline][PAD] \quad \text{(Equation 4)}$$

Thus since the quantities L and 2L are measured and known, the two variable PAD and Tline can be obtained through matrix manipulations and simultaneously solving the two equations, as:

$$[PAD][PAD] = [[L]^{-1}[2L]/[L]^{-1}]^{-1} \quad \text{(Equation 5)}$$

$$[Tline] = [PAD]^{-1}/[L][PAD]^{-1} \quad \text{(Equation 6)}$$

As the characteristics of PAD in Equation 5 are all measured characteristics, the PAD matrix can be solved, and the Tline characteristics are thus available from Equation 6. Thus by simple calculation the values for [PAD] and the [Tline] may be obtained; and these can be used to de-embed the parasitics from any measurements taken using a trace that is the same as the Tline trace in the first metal.

A method for measuring the resistance of the TSVs in FIG. 10 is now provided. Because the trace and pad values can be de-embedded using the test structures of FIG. 11 and Equations 5 and 6, a value for a resistance that includes the metal BM_L in FIG. 10 is easily obtained. By measuring test structures having different lengths of this bottom metal material, and de-embedding the pads and top metal traces for each measurement, a plot of the resistance which includes a variable resistance proportional to the length of the BM_L portion, and the fixed resistance of 2 TSVs, can be made. Using extrapolation the value of the resistance of 2 TSVs (15 and 16 in FIG. 10, for example) is obtained.

Figure 12:
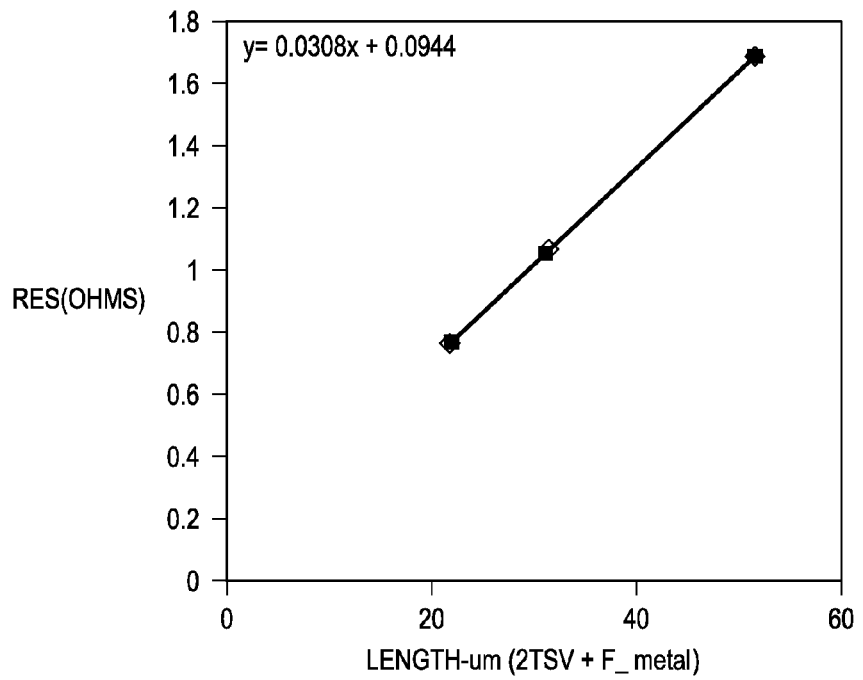
FIG. 12 depicts a resistance plot obtained with an embodiment.

FIG. 12 depicts an example of the results obtained using this extrapolation technique. In FIG. 12, several resistance data points are shown plotted on the vertical axis for a measured resistance path having a length BM_L from 20-100 ums, (length is on the horizontal axis) and a slope formula is extracted, which in this simple example is y=0.0308x+0.0944. That is, the value at length BM_L=0 is extrapolated as 0.0944. This is the resistance for 2 TSVs so an extrapolated R value for one TSV would be 0.0472 ohms, or 47.2 milliohms. A measured value at WAT was 38 milliohms at DC. This DC WAT value shows the accuracy of the extrapolation method. The actual values of R for the TSVs is very low, however by measuring the test structure of two TSVs and the backside metal, the accuracy of the measurement is actually improved; and the extrapolated resistance value is very accurate.

Figure 13:
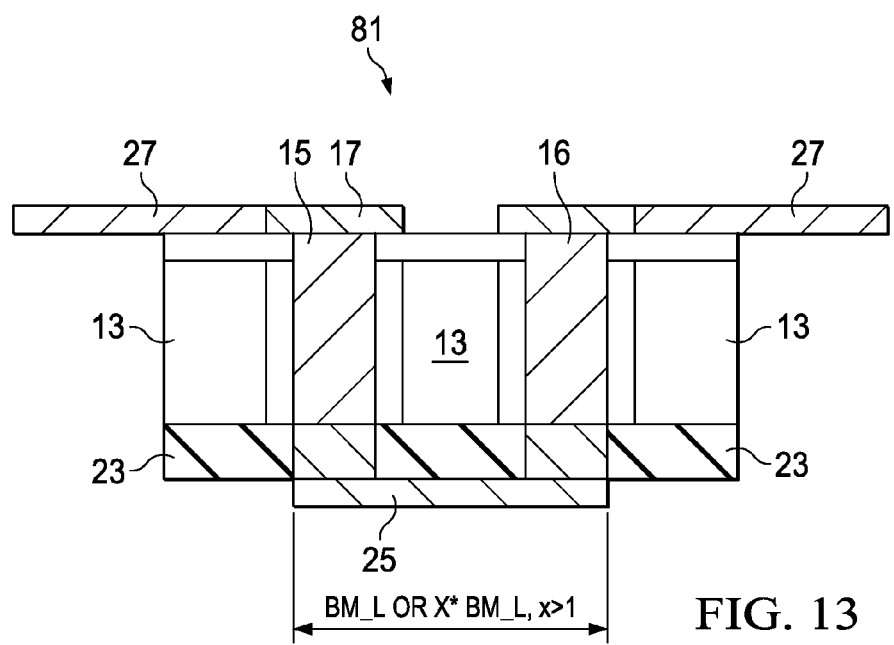
FIG. 13 depicts a cross-section of another structure depicting de-embedding.

As shown in FIG. 10, a partial de-embedding would remove the traces 27 from the structure 81. FIG. 12 depicts the same structure showing the de-embedding needed (indicated by dashed lines) to remove the parasitic values from the intrinsic values for the TSVs. The bottom metal portion 25 would also have to be de-embedded. Method embodiments are now presented for performing de-embedding to provide the intrinsic characteristics of the TSVs 15, 16 in FIG. 13.

In the method, additional test structures are provided that include 2 TSVs coupled in series with a length of bottom metal 25. For example a first one may have a length BM_L, and a second length may be X*BM_L, where X is >1. Note that in the above explanation of the test structures of FIG. 11, X value of 2 was used (L, 2L) but this may be generalized to X, where X is >1; for example 1.5 may be used.

A new set of equations is obtained by substituting [TSV] for the [PAD] characteristics above, and [BM_L_Tline] for [Tline]; so these equations are:

$$[BM\_L]=[TSV][BM\_L\_Tline][TSV] \quad \text{(Equation 7)}$$

$$[X*BM\_L]=[TSV][BM\_L\_Tline*X][TSV] \quad \text{(Equation 8)}$$

Figure 14:
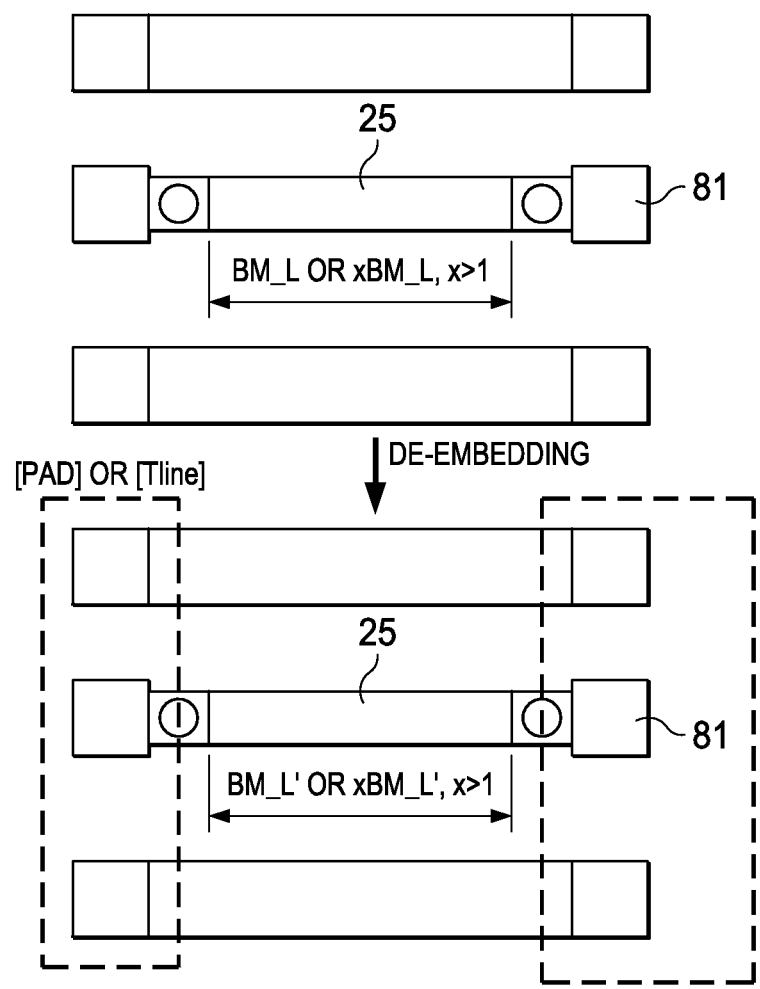
FIG. 14 depicts in a plan view test structures for use with an embodiment.

FIG. 14 illustrates in a top view of the TSV test structure 81 both prior to, and after de-embedding of the PAD and Tline portions, indicated by the dashed areas. There will be two TSV devices under test, "DUTs". Each will have different lengths for the BM_L 25, which will enable the use of the ABCD matrix or T matrix forms of the intrinsic characteristic in the equations above, and the two measurements then set up the simultaneous equation solutions described above for obtaining the de-embedded version of [TSV]; the intrinsic characteristics of the TSV.

Thus again the measured characteristics [BM_L] and [X*BM_L] are used with two equations and two variables, which can be manipulated and solved. However, to obtain the two measured characteristics needed for equations 7 and 8, the two test structures such as 81, with two different lengths for BM_L, are measured, and also the test structures 85 and 95 of FIG. 11; for the top metal traces and pads, the values for PAD and Tline are obtained. These values are then used to de-embed the measurements for the TSV test structures. Then, the two equations 7 and 8 may be solved simultaneously and obtain the de-embedded values for TSV.

FIG. 14 illustrates in a top view of the TSV test structure 81 is shown in FIG. 14 both prior to, and after de-embedding of the PAD and Tline portions, indicated by the dashed areas. There will be two devices under test, DUTs. Each will have two different lengths for the BM_L 25, which will enable the use of the ABCD matrix or T matrix forms of the intrinsic characteristic in the equations above, and the two measurements sets up the simultaneous equation solutions described above for obtaining the de-embedded version of [TSV]; the intrinsic characteristics of the TSV.

Figure 15:
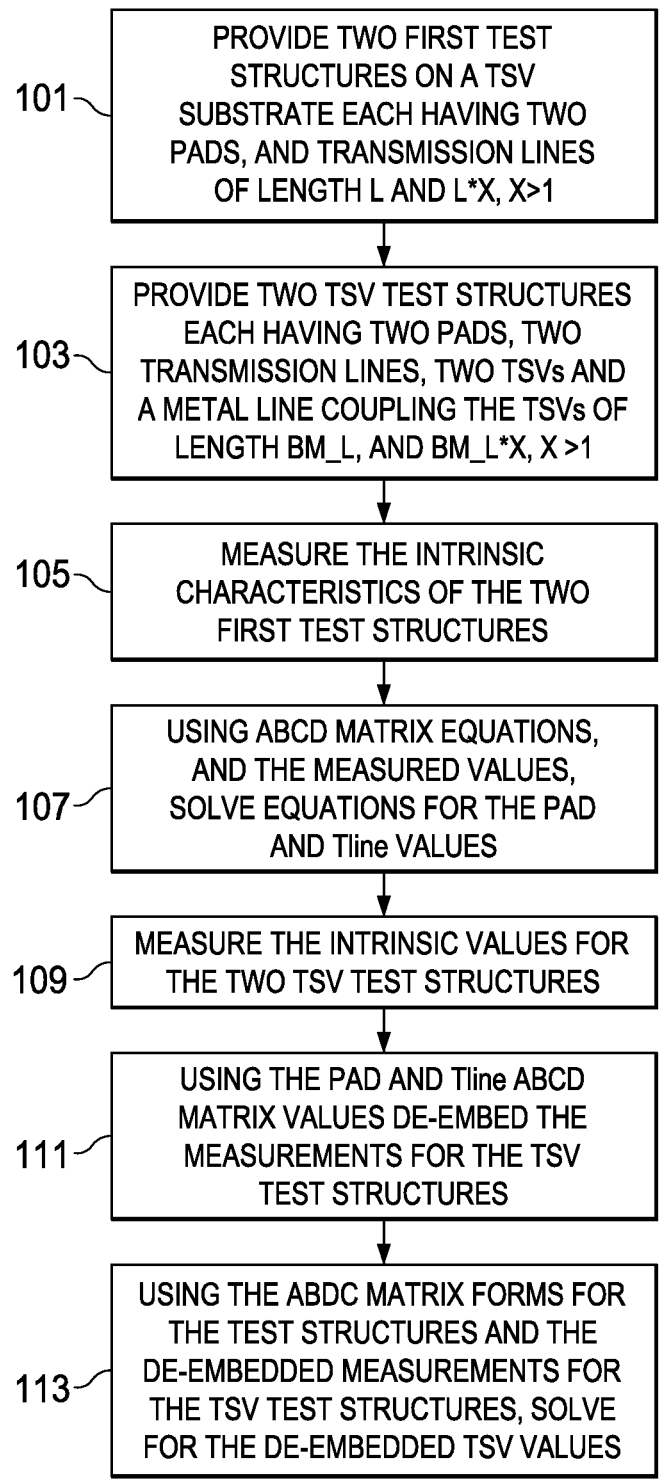
FIG. 15 depicts in a flow diagram a method embodiment.

FIG. 15 depicts in a flow chart a method embodiment for performing the above de-embedding methods. In step 101, two test structures are provided each having two pads and a transmission line, one transmission line of length L, and one of length X*L, where X>1, for example, in the illustration in FIG. 11 above, X was 2.

In step 103, two TSV test structures are provided. Each has two pads, two transmission lines, two TSVs and a metal line (bottom metal portion 25 for example in FIG. 13) of length BM_L in the first test structure, and BM_L*X in the second structure.

In step 105 a first pair of measurements of intrinsic characteristics is made, using the first pair of test structures, and for example an RF wafer probe using a GSG set up. Other frequencies such as 200 Mhz can be used for example, or DC, so long as the measurements are consistent.

In step 107, a first equation pair is formed for the first two test structures and using the ABCD matrix or T matrix manipulations, the equations are solved for the intrinsic characteristics of the pads and the transmission lines.

In step 109, the two TSV structures are measured for the intrinsic characteristics, however these measurements include the pad and transmission lines needed to couple the probes to the test structures.

In step 111, the pad and transmission line values are used to de-embed the measurements of the test structures for the TSVs.

In step 113, the two equations in ABCD form are set up for the TSV test structures, and using the de-embedded measurements, these are solved for the de-embedded intrinsic values for the TSVs.

The methods above for the test structures and TSV test structures assume a grounded substrate is used in the measurements. This is typically true when there are active devices on the substrate. However, it may not be true when the substrate is an interposer without active devices. In this case, the substrate may float. A floating substrate will couple to other signal lines, as is known, by capacitive and inductive coupling. Thus extra shielding between the pads and the substrate, or the backside metal and the substrate, may be required in these cases. The parasitic capacitor between the interposer substrate and shielding shall be larger than 5 pH, which may combine with MIM capacitor or MOM capacitor, to make little influence to DUT, which is TSV, as mentioned.

An apparatus embodiment is provided, comprising a substrate comprising at least two or more through substrate vias ("TSVs"); a plurality of test structures for de-embedding parasitics from a device under test path including at least two of the at least two or more TSVs and at least two pads, the plurality of test structures further comprising a first transmission line test structure of length L and a first pair of pads, the pads coupling to either end of the first transmission line test structure; a second transmission line test structure of length L*X, where X is greater than 1, and a second pair of pads, the pads coupling to either end of the second transmission line; a first TSV test structure comprising two TSVs coupled by a first metal line of length L, the TSVs coupled to either end of the metal line; and a second TSV test structure comprising two TSVs coupled by a second metal line of length L*X.

A method embodiment is provided, comprising providing on a substrate having at least two through substrate vias ("TSVs") a plurality of test structures for de-embedding the measurement of the intrinsic characteristics of a device under test (DUT) including at least two of the TSVs; measuring the intrinsic characteristics [L] for a first test structure on the substrate including two pads coupled with a transmission line of length L; measuring the intrinsic characteristics [LX] of a second test structure on the substrate including two pads coupled with a transmission line of length L*X, where X is greater than 1; measuring the intrinsic characteristics [BM_L] of a third test structure on the substrate including a first metal line of length [L] and at least two TSVs; measuring the intrinsic characteristics [BM_LX] of a fourth test structure on the substrate including a second metal line of length L*X and at least two TSVs; using simultaneous solutions of ABCD matrix or T matrix form equations for L and LX, and the measured intrinsic characteristics, solving for the intrinsic characteristics of the pads and the transmission lines; de-embedding the measured intrinsic characteristics of the third and fourth test structures; and using simultaneous solutions of ABCD matrix or T matrix form equations for BM_L and BM_LX, and the measured intrinsic characteristics, solving for the intrinsic characteristics of the TSVs and the metal lines.

In yet another method embodiment, a method comprises providing a through substrate via (TSV) device under test extending through and disposed on a substrate; providing a plurality of surrounding TSVs around the device under test on the substrate; coupling a signal to the TSV device under test on a front side of the substrate; providing a back side metal coupling the TSV device under test and the surrounding TSVs at the back side of the substrate; providing a dummy structure equal in area to the back side metal area of the back side metal;

supplying a signal to TSV device under test; and receiving the signal through the surrounding TSVs coupled in parallel.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
   providing a through substrate via ("TSV") device under test extending through and disposed on a substrate;
   providing a plurality of surrounding TSVs around the device under test on the substrate;
   coupling a signal to the TSV device under test on a front side of the substrate;
   providing a back side metal coupling the TSV device under test and the surrounding TSVs at the back side of the substrate;
   providing a dummy structure equal in area to the back side metal area of the back side metal;
   supplying a signal to TSV device under test; and
   receiving the signal through the surrounding TSVs coupled in parallel.

2. The method of claim 1, wherein a resistance of the TSV device under test is determined by making a measurement of the resistance of the signal through the TSV device under test, the backside metal, and the surrounding TSVs; and
   subtracting the resistance due to the dummy structure.

3. The method of claim 1, wherein the TSV device under test and the surrounding TSVs each are lined with a dielectric and each forms a capacitance from TSV to substrate and the capacitance is further measured by:
   coupling a positive voltage bias to the TSV device under test;
   coupling a negative voltage bias to the surrounding TSVs in parallel; and
   measuring the total capacitance, the capacitance for the TSV device under test approximately equal to the total capacitance when the number of surrounding TSVs is greater than 10.

4. The method of claim 1 wherein the substrate is floating.

5. The method of claim 4, further comprising providing a MOM or MIM capacitor between the TSV device under test and the substrate.

6. A method, comprising:
   providing on a substrate having at least two through substrate vias ("TSVs") a plurality of test structures for de-embedding the measurement of the intrinsic characteristics of a device under test (DUT) including at least two of the TSVs;
   measuring the intrinsic characteristics [L] for a first test structure on the substrate including two pads coupled with a transmission line of length L;
   measuring the intrinsic characteristics [LX] of a second test structure on the substrate including two pads coupled with a transmission line of length L*X, where X is greater than 1;
   measuring the intrinsic characteristics [BM_L] of a third test structure on the substrate including a first metal line of length [L] and at least two TSVs;
   measuring the intrinsic characteristics [BM_LX] of a fourth test structure on the substrate including a second metal line of length L*X and at least two TSVs;
   using simultaneous solutions of ABCD matrix or T matrix form equations for L and LX, and the measured intrinsic characteristics, solving for the intrinsic characteristics of the pads and the transmission lines;
   de-embedding the measurements of the third and fourth test structures using the intrinsic characteristics of the pads and the transmission lines; and
   using simultaneous solutions of ABCD matrix or T matrix form equations for BM_L and BM_LX, and the measured intrinsic characteristics, solving for the intrinsic characteristics of the TSVs and the metal lines.

7. The method of claim 6, wherein the intrinsic characteristics of the pads and the transmission lines are used to de-embed the parasitic values from a resistance measurement of two TSVs and a metal line; and
   extrapolation is used to determine the resistance of two TSVs.

8. The method of claim 7, and further comprising:
   measuring the intrinsic characteristics of a device under test comprising a first pad coupled by a first transmission line on a first surface of the substrate to a first TSV, a metal line formed on a second opposite surface of the substrate, a second TSV, a second transmission line formed on the first surface of the substrate, and a second pad; and
   de-embedding the parasitic values due to the first pad, the first transmission line, the second pad, the second transmission line, and the metal line, to extract the intrinsic characteristics of the two TSVs.

9. The method of claim 7, wherein measuring the intrinsic characteristics comprises performing a ground signal ground RF probe at a wafer test station.

10. The method of claim 7, wherein providing a substrate further comprises providing a substrate including active transistor devices formed upon the substrate.

11. The method of claim 7, wherein providing a substrate further comprises providing an interposer substrate free from active transistor devices.

* * * * *